(12) United States Patent
Grassmann (10) Patent No.: US 11,908,760 B2
(45) Date of Patent: Feb. 20, 2024

(54) PACKAGE WITH ENCAPSULATED ELECTRONIC COMPONENT BETWEEN LAMINATE AND THERMALLY CONDUCTIVE CARRIER

(71) Applicant: Infineon Technologies AG, Neubiberg (DE)

(72) Inventor: Andreas Grassmann, Regensburg (DE)

(73) Assignee: Infineon Technologies AG, Neubiberg (DE)

(*) Notice: Subject to any disclaimer, the term of this patent is extended or adjusted under 35 U.S.C. 154(b) by 87 days.

(21) Appl. No.: 17/575,015

(22) Filed: Jan. 13, 2022

(65) Prior Publication Data
US 2022/0230930 A1  Jul. 21, 2022

(30) Foreign Application Priority Data
Jan. 15, 2021 (DE) ...................... 10 2021 100 717.8

(51) Int. Cl.
*H01L 23/31* (2006.01)
*H01L 23/29* (2006.01)
*H01L 23/14* (2006.01)
*H01L 21/56* (2006.01)

(52) U.S. Cl.
CPC ............. *H01L 23/31* (2013.01); *H01L 21/56* (2013.01); *H01L 23/14* (2013.01); *H01L 23/29* (2013.01)

(58) Field of Classification Search
CPC ...................................................... H01L 23/31
USPC ........................................................ 257/788
See application file for complete search history.

(56) References Cited

U.S. PATENT DOCUMENTS

| | | |
|---|---|---|
| 5,442,142 A | 8/1995 | Hayashi |
| 8,120,158 B2 | 2/2012 | Ewe et al. |
| 2004/0082100 A1 | 4/2004 | Tsukahara et al. |
| 2005/0206010 A1 | 9/2005 | Noquil et al. |
| 2009/0084596 A1 | 4/2009 | Inoue et al. |
| 2009/0129028 A1 | 5/2009 | Son et al. |
| 2010/0025082 A1 | 2/2010 | Sasoka et al. |
| 2013/0285260 A1 | 10/2013 | Denison et al. |
| 2014/0273349 A1 | 9/2014 | Lim et al. |
| 2015/0092380 A1* | 4/2015 | Hohlfeld ................ H05K 3/368 361/783 |
| 2016/0086876 A1* | 3/2016 | Otremba ............. H01L 23/3107 257/676 |
| 2018/0301444 A1* | 10/2018 | Roth ................. H01L 23/49537 |
| 2020/0258824 A1 | 8/2020 | Maldo et al. |

FOREIGN PATENT DOCUMENTS

| | | |
|---|---|---|
| DE | 693 31 676 | 11/2002 |
| DE | 10 2010 038 154 | 5/2011 |
| DE | 10 2011 121 808 | 6/2013 |

* cited by examiner

*Primary Examiner* — Ajay Arora
(74) *Attorney, Agent, or Firm* — Dicke, Billig & Czaja, PLLC (57) ABSTRACT

A package is disclosed. In one example, the package comprises a carrier comprising a thermally conductive and electrically insulating layer, a laminate comprising a plurality of connected laminate layers, an electronic component mounted between the carrier and the laminate. An encapsulant is at least partially arranged between the carrier and the laminate and encapsulating at least part of the electronic component.

20 Claims, 5 Drawing Sheets

PACKAGE WITH ENCAPSULATED ELECTRONIC COMPONENT BETWEEN LAMINATE AND THERMALLY CONDUCTIVE CARRIER

CROSS-REFERENCE TO RELATED APPLICATION

This Utility Patent Applications claims priority to German Patent Application No. 10 2021 100 717.8, filed Jan. 15, 2021, which is incorporated herein by reference.

BACKGROUND

Technical Field

Various embodiments relate generally to a package, an electronic device, and a method of manufacturing a package.

Description of the Related Art

Packages may be denoted as usually encapsulated electronic components with electrical connects, such as leads, extending out of the encapsulant. For example, packages may be connected to an electronic periphery by leads, for instance mounted on a printed circuit board and/or connected with a heat sink, and may be connected via connectors to a larger system.

Packaging cost is an important driver for the industry. Related with this are performance, dimensions and reliability. The different packaging solutions are manifold and have to address the needs of a specific application.

There may be a need for a package with high reliability and high performance.

BRIEF DESCRIPTION OF THE DRAWINGS

The accompanying drawings, which are included to provide a further understanding of exemplary embodiments and constitute a part of the specification, illustrate exemplary embodiments.

In the drawings.

DETAILED DESCRIPTION

According to an exemplary embodiment, a package is provided which comprises a carrier comprising a thermally conductive and electrically insulating layer, a laminate comprising a plurality of connected laminate layers, an electronic component mounted between the carrier and the laminate, and an encapsulant being at least partially arranged between the carrier and the laminate and encapsulating at least part of the electronic component.

According to another exemplary embodiment, an electronic device is provided which comprises a package having the above mentioned features, and a mounting base on which the package is mounted.

According to yet another exemplary embodiment, a method of manufacturing a package is provided, wherein the method comprises providing a carrier comprising a thermally conductive and electrically insulating layer, providing a laminate comprising a plurality of connected laminate layers, mounting an electronic component between the carrier and the laminate, and encapsulating at least part of the electronic component by an encapsulant being at least partially arranged between the carrier and the laminate.

According to an exemplary embodiment, a package with an at least partially encapsulated electronic component mounted between a thermally conductive carrier (for example a Direct Copper Bonding (DCB) substrate) and a laminate board (such as a printed circuit board (PCB)) is provided. Since the laminate comprises a thermally conductive and electrically insulating layer, the carrier may define a heat removal path for removing heat created by the electronic component during operation of the package while electrically insulating the electronic component, for example with respect to an exterior of the package. At the same time and on an opposing side, the electronic component may be electrically coupled with the laminate which may comprise a layer sequence of electrically conductive layers and electrically insulating layers. Thus, the laminate—which may for instance provide a routing or a redistribution layer functionality—may fulfil an electric coupling function for the electronic component so that an electric signal path of the package for electrically connecting the electronic component may be defined at least partially within the laminate. At the same time, the carrier and the laminate as well as an encapsulant may ensure a proper mechanical protection of the electronic component within the package, as well as an electrical insulation of the electronic component. As a result, a package having excellent electric, thermal and mechanical reliability and thus a high performance may be obtained. Moreover, the described package design provides a high flexibility for integration of one more electronic components for various applications by the hybrid laminate-carrier package architecture. Furthermore, the encapsulated package being arranged on the heat removing carrier and being electrically coupled with the laminate may benefit from low stray inductance thanks to the possibility to conduct electric signals substantially antiparallel to each other through electrically conductive layers of the laminate. This may reduce losses and may increase a switching speed of a switch-type electronic component or package. Moreover, connecting the electronic component between carrier and laminate may simplify manufacturability, since a significant conventional manufacturing effort in terms of wire bonding may be reduced or even fully eliminated by exemplary embodiments.

In the following, further exemplary embodiments of the package, the electronic device, and the method will be explained.

In the context of the present application, the term "package" may particularly denote an electronic member which may comprise one or more electronic components mounted on a carrier. Said constituents of the package may be optionally encapsulated at least partially by an encapsulant.

For example, many packages may be manufactured simultaneously as a batch before being separated into individual packages.

In the context of the present application, the term "carrier" may particularly denote a support structure which serves as a mechanical support for the one or more electronic components to be mounted thereon. In other words, the carrier may fulfil a mechanical support function. Additionally or alternatively, a carrier may also fulfill a heat removal function and/or an electrical connection function. A carrier may comprise or consist of a single part, multiple parts joined via encapsulation or other package components, or a subassembly of carriers. For instance, the carrier may be a ceramic carrier coated with metal.

In the context of the present application, the term "thermally conductive and electrically insulating layer" may particularly denote a layer or sheet made of a dielectric material which is incapable of conducting electricity and therefore functions as electric insulator. At the same time, the material of said layer may be capable of conducting heat, for instance may have a thermal conductivity of at least 10 W/mK, preferably of at least 50 W/mK.

In the context of the present application, the term "laminate" may particularly denote an array of stacked and interconnected parallel layers. Interconnection of such a layer stack may be accomplished by pressing the layers together while applying heat. For example, such a laminate may be a printed circuit board.

In the context of the present application, the term "electronic component" may in particular encompass a semiconductor chip (in particular a power semiconductor chip), an active electronic device (such as a transistor), a passive electronic device (such as a capacitance or an inductance or an ohmic resistance), a sensor (such as a microphone, a light sensor or a gas sensor), an actuator (for instance a loudspeaker), and a microelectromechanical system (MEMS). In particular, the electronic component may be a semiconductor chip having at least one integrated circuit element (such as a diode or a transistor) in a surface portion thereof. The electronic component may be a naked die or may be already packaged or encapsulated. Semiconductor chips implemented according to exemplary embodiments may be formed for example in silicon technology, gallium nitride technology, silicon carbide technology, etc.

In the context of the present application, the term "encapsulant" may particularly denote a substantially electrically insulating and preferably thermally conductive material surrounding at least part of an electronic component and optionally at least part of carrier and/or laminate. For instance, the encapsulant may be a mold compound and may be created for example by transfer molding. Alternatively, the encapsulant may be a casting compound formed by casting.

In the context of the present application, the term "mounting base" may in particular denote a support body (such as a plate) on which the package may be assembled, for instance together with one or more further packages. In particular, such a support body may be mechanically and electrically coupled with the package(s). In particular, the mounting base may be a plate-shaped electronic mounting base, such as a printed circuit board (PCB). It is also possible that the mounting base is a patterned metal plate such as a leadframe. An electric connection between mounting base and package may be established by a connection medium, such as a solder or sinter material, or an electrically conductive adhesive.

In an embodiment, the electronic component may be mounted on an exterior surface of the carrier and may be mounted on an exterior surface of the laminate. While the laminate may accomplish an electric connection of the electronic component on one side thereof and in particular without the need of providing leads, the carrier may thermally couple the electronic component on the opposing other side. The package may be free of leads.

In an embodiment, the carrier comprises a first electrically conductive layer (which may be continuous or patterned) on a first main face of the thermally conductive and electrically insulating layer. The first electrically conductive layer of the carrier may face the electronic component and may for instance be used for establishing an electrically conductive connection with the electronic component, for instance by soldering. In embodiments in which also the bottom side of the electronic component comprises at least one pad, the first electrically conductive layer may establish an electrically conductive connection of this pad and may thereby contribute to the electric connectivity within the package.

In an embodiment, the carrier comprises a second electrically conductive layer (which may be continuous or patterned) on a second main face of the thermally conductive and electrically insulating layer opposing the first main face. The second electrically conductive layer of the carrier may face away from the electronic component and may for instance form an exterior surface portion of the package. Hence, the second electrically conductive layer may be used for establishing a connection with a metallic cooling unit, for instance a heat sink with cooling fins, to be connected to the carrier-side of the package for further improving the cooling performance.

In an embodiment, the thermally conductive and electrically insulating layer comprises or consists of a ceramic, in particular may be a ceramic plate. Advantageously, the thermally conductive and electrically insulating layer may comprise or consist of a ceramic and/or may have a thermal conductivity of at least 10 W/mK. This may ensure a high thermal conductivity at a reliable dielectric behaviour. For example, aluminum oxide (for example having a thermal conductivity of more than 20 W/mK) or aluminum nitride (for example having a thermal conductivity of even 200 W/mK or more) may be used as said ceramic.

In an embodiment, the package comprises an electrically conductive connection medium, in particular solder, between the electronic component and the carrier. On the one hand, this allows to form a mechanically highly reliable connection in between. On the other hand, the electric connection between bottom side of electronic component and top side of carrier may optionally contribute to an electric signal path within the package. This may be advantageous in particular when the electronic component has a vertical current flow.

In an embodiment, an electrically conductive layer of the carrier faces the encapsulant. An electrically insulating encapsulant may then contribute to an electric isolation between carrier and laminate, or at least between parts thereof.

In an embodiment, the carrier comprises one of the group consisting of a Direct Copper Bonding (DCB) substrate, a Direct Aluminum Bonding (DAB) substrate, an Insulated Metal Substrate (IMS), and an Active Metal Brazing (AMB) substrate. In particular, it may be possible that the carrier comprises a stack composed of a central electrically insulating and thermally conductive layer (such as a ceramic layer) covered on both opposing main surfaces by a respective electrically conductive layer (such as a copper layer or an aluminium layer). The respective electrically conductive layer may be a continuous or a patterned layer.

In an embodiment, the laminate comprises at least one dielectric layer and at least one electrically conductive layer. Preferably, the laminate comprises a plurality of dielectric layers and/or a plurality of electrically conductive layers. A respective dielectric layer may comprise epoxy resin and glass fibers, and may in particular be made of FR4. A respective electrically conductive layer may comprise copper. Such an electrically conductive layer may comprise a structured copper foil or plated copper layer. It is also possible that such an electrically conductive layer comprises one or more copper vias and/or one or more copper pillars.

In an embodiment, the package comprises an electrically conductive connection medium, in particular solder, between the electronic component and the laminate. Correspondingly, the method may comprise mounting the electronic component on the laminate by an electrically conductive connection medium, in particular by soldering. In particular, the laminate and one or more pads of the electronic component may be electrically conductively connected with each other so as so provide the electric functionality of the package partially or entirely.

In an embodiment, an electrically conductive layer of the laminate faces the encapsulant. This allows so establish a short vertical electric connection path between laminate and electronic component.

In an embodiment, the package comprises one or more electrically conductive through connections (such as at least one via or pillar) extending through the encapsulant and electrically coupling at least one of the electronic component and the carrier with the laminate. In an embodiment, the electrically conductive through connection between the laminate and the carrier may be arranged side by side with the electronic component. For instance, such an electrically conductive through connection may be a metal-filled through mold via extending vertically through the encapsulant to thereby electrically connect an electrically conductive upper side of the carrier with an electrically conductive lower side of the laminate. This may also establish an electrically conductive connection between a pad at the bottom side of the electronic component and the laminate on top of the electronic component. With such a connection architecture, very short signal paths may be established having a vertical path section extending through the encapsulant.

In an embodiment, the electronic component is a semiconductor power chip. For instance, a corresponding power semiconductor application may be realized by the chip(s), wherein integrated circuit elements of such a power semiconductor chip may comprise at least one transistor (in particular a field effect transistor such as a MOSFET (metal oxide semiconductor field effect transistor) or a bipolar transistor such as an IGBT (insulated gate bipolar transistor)), at least one diode, etc. It is also possible that the at least one electronic component comprises a controller circuit, a driver circuit, etc. One or more of these and/or other circuits may be integrated into one semiconductor chip, or separately in different chips. In particular, packages fulfilling a half-bridge function, a full-bridge function, etc., may be manufactured. In another embodiment, the at least one electronic component may be a logic die.

In an embodiment, the electronic component experiences a vertical current flow during operation. This may keep the electric connection paths short. For the example of a field effect transistor chip, electric current may flow between a drain pad on a lower main surface of the power component through semiconductor material of the power component to another pad at an upper main surface of the power component. At the upper main surface of the power component, a source pad and a gate pad may be formed.

As mentioned above, the electronic component may be a transistor chip, such as a field effect transistor chip (for instance a metal oxide semiconductor field effect transistor, MOSFET, chip). Such a transistor chip may have a source pad and a gate pad which face the laminate and may have a drain pad facing the carrier. However, it is also possible that the electronic component is a bipolar transistor chip, for instance having an insulated gate bipolar transistor (IGBT). In yet another embodiment, the electronic component may comprise a diode.

In an embodiment of the electronic device, the mounting base is physically connected with the laminate. In other words, the package may be connected on its laminate-side with the mounting base. In particular, the connection between mounting base and laminate may be so that electric signals can be transmitted between package and mounting base via the laminate. Hence, the mounting base and the laminate may for example be connected by an electrically conductive connection medium, such as a solder.

In an embodiment, the electronic device comprises a cooling body, in particular a heat sink, physically connected with the carrier. Thus, the carrier-side of the electronic device may be connected with such a heat sink or any other kind of cooling unit. For instance, such a heat sink may comprise a thermally conductive plate (for instance a metal plate) which may be connected to the carrier-side of the package, for instance to a surface portion of the package formed by an exposed electrically conductive layer of the carrier. A plurality of cooling fins may extend from the thermally conductive plate for promoting heat transfer from the package to a thermal environment of the electronic device. The cooling body and the carrier may for example be connected by an electrically conductive connection medium, such as a solder.

In embodiments, an electrically conductive connection medium may connect the electronic component with the laminate, the electronic component with the carrier, the carrier with a cooling body, and/or the laminate with a mounting base. In an embodiment, such an electrically conductive connection medium comprises at least one of the group consisting of a solder, in particular a transient liquid phase solder (TLPS), a sinter material, and an electrically conductive adhesive. For instance, sintering (such as silver sintering), soldering (for instance soft soldering or diffusing soldering), or the use of a hybrid glue may be preferred interconnection options. Particularly preferred may be the use of transient liquid phase soldering for lead-free joining of constituents of a package for instance embodied as power electronic module. Interconnection by transient liquid phase soldering may be based on a phase transformation using a low melting solder powder (like eutectic tin based solder) and a high melting powder (such as copper). An interconnection resulting from a corresponding solder process, which can be created at a moderate solder temperature, may be substantially free of voids and may comprise intermetallic phases. As a result, a re-melting temperature of such a joint can be increased.

In an embodiment, the encapsulant encapsulates at least part of the carrier and/or at least part of the laminate. In such embodiments, not only the electronic component, but also at least part of carrier and/or laminate may be encapsulated (for example FIG. 9 and FIG. 10). Thus, the encapsulant may also mechanically protect and/or electrically insulate constituents of carrier and/or laminate. In yet another embodiment, however, encapsulant material may only be present in a plate-shaped region between carrier and laminate and may laterally surround only the electronic component (compare for example FIG. 1).

In an embodiment, the laminate layers are configured to form a redistribution structure, in particular a redistribution layer (RDL). Such a redistribution structure may be formed by electrically conductive layers of the laminate on the electronic component which may make one or more pads of the electronic component available at an exterior side of the package for external access. The laminate layers may in particular route electric signals within the laminate.

In an embodiment, the laminate layers are configured to form antiparallel electric connection paths. By creating different electric connection paths in the laminate through which electric signals flow antiparallel to each other, parasitic or stray inductances may be significantly reduced. Consequently, a low loss of electric signals propagating in the package may be possible, and a high switching speed may be achieved in applications in which the electronic component contributes to a switching function.

In an embodiment, the package comprises at least one further component embedded in and/or surface mounted on the laminate. Such a further component may be another electronic component. For example, such a further component may be an active component, such as a semiconductor transistor chip. It is however also possible that such a further component is a passive component, for example an inductance, a capacitance, a resistor or the like. Advantageously, such a further component may be embedded within the laminate, which may result in a space-saving configuration. Additionally or alternatively, it is possible to surface mount such a further component on the laminate, for instance at an exterior main surface of the package or encapsulated within the encapsulant. Advantageously, the electronic component mounted between carrier and laminate may functionally cooperate with said at least one further embedded and/or surface mounted component, wherein an electric coupling between such components may be established by electric layers of the laminate.

In an embodiment, the carrier is configured to thermally couple and electrically insulate the electronic component with respect to an exterior of the package. For this purpose, a continuous sheet of electrically insulating and thermally conductive material may be provided in the carrier, wherein said sheet may extend over the entire lateral width of the carrier, such as a vertically central ceramic sheet.

In an embodiment, the package comprises a bolt member mounted (for instance by soldering) on the laminate and being configured for establishing an electrically conductive connection with a counterpart device, in particular by screwing. For instance, such a bolt member may be partially encapsulated in the encapsulant and may partially extend beyond the encapsulant. By such a bolt member, the package may be equipped with a screwing interface for establishing a screw connection with a counterpart device. However, as an alternative to a bolt member, it is also possible to provide one or more electrically conductive bumps at the laminate for interconnection with the mounting base.

In an embodiment, the mounting base comprises one of the group consisting of a printed circuit board (PCB) and a leadframe (i.e. a patterned metal sheet). Other mounting bases are possible as well, for instance any mounting board.

In an embodiment, the method comprises connecting the electronic component, being already mounted on the laminate, with the carrier by an electrically conductive connection medium, in particular by soldering. Hence, the electronic component may first be assembled on the laminate, for instance may be surface mounted on the laminate, before connecting an opposing other side of the electronic component with the carrier. This may be advantageous, since the alignment accuracy of the assembly of the electronic component on the laminate, which may provide the electric circuitry for electrically interconnecting the electronic component, may be more critical than the alignment accuracy of the electronic component on the carrier which may fulfil predominantly a thermal function. It is however also possible that the connection between the electronic component on the one hand and the carrier and the laminate on the other hand are carried out simultaneously.

In an embodiment, the method comprises carrying out the encapsulating after the mounting. Thus, the encapsulation may laterally glue in place the electronic component being already vertically sandwiched between carrier and laminate.

In an embodiment, the package comprises a plurality of electronic components mounted on the carrier or on different carriers. Thus, the package may comprise one or more electronic components (for instance at least one passive component, such as a capacitor, and at least one active component, such as a semiconductor chip).

In an embodiment, the package is configured as power converter, in particular one of an AC/DC power converter and a DC/DC power converter. However, also other electronic applications, such as inverters, etc., may be possible.

As substrate or wafer for the semiconductor chips, a semiconductor substrate, in particular a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology.

Furthermore, exemplary embodiments may make use of standard semiconductor processing technologies such as appropriate etching technologies (including isotropic and anisotropic etching technologies, particularly plasma etching, dry etching, wet etching, laser removal), patterning technologies (which may involve lithographic masks), deposition technologies (such as chemical vapor deposition (CVD), plasma enhanced chemical vapor deposition (PECVD), atomic layer deposition (ALD), sputtering, etc.).

The above and other objects, features and advantages will become apparent from the following description and the appended claims, taken in conjunction with the accompanying drawings, in which like parts or elements are denoted by like reference numbers.

The illustration in the drawing is schematically and not to scale.

Before exemplary embodiments will be described in more detail referring to the figures, some general considerations will be summarized based on which exemplary embodiments have been developed.

Conventional ceramic based power modules may have a high number of wire bonds in each module. Furthermore, such conventional power modules may have an only limited reliability with respect to power cycling, as well as a limited yield. Furthermore, the manufacturing effort may be high if many bonds are necessary, particularly in view of the fact that bonding, being a serial process, may be cumbersome. Furthermore, an electric routing capability on a carrier having only one metallic layer on one side of a ceramic plate may be insufficient for high performance applications. Apart from this, such a conventional package design may be limited in terms of design options to reduce the stray inductance of an electric path. Apart from this, it may be difficult to integrate passive components or power chips in a conventional package. Also the manufacture of a larger system using such a conventional package may involve significant effort, since a user may need a separate gate drive board (PCB) for attachment to the power module.

Exemplary embodiments may overcome at least part of the mentioned and/or other shortcomings.

According to an exemplary embodiment, a package (in particular embodied as power module) is provided in which an electronic component (such as a power semiconductor chip) is sandwiched between a bottom-sided thermally conductive carrier and a top-sided laminate for ensuring signal routing. This combines a high thermal reliability thanks to the efficient heat removal accomplished by the carrier, a high electric reliability due to the isolation by the carrier and a low-loss electric signal management by the laminate, as well as a high mechanical reliability due to the mechanical protection of the electronic component by the encapsulant as well as by the bottom-sided carrier and the top-sided laminate (or vice versa). Consequently, a package architecture with high performance and a high freedom of design may be provided.

More specifically, an exemplary embodiment provides a package which may be embodied as power module and which may be built based on a laminate (such as a PCB), which acts as a frontside interconnect, and a thermally conductive carrier (such as a DCB or an AMB ceramic substrate), as backside interconnect and optionally as a thermal interface to a cooling body (for instance a heat sink). Advantageously, an exemplary embodiment may make it possible to replace conventional wire bonds partially or entirely by flip chip mounting of an electronic component to a laminate (for instance PCB) in a high power module.

Concerning manufacture of a package according to an exemplary embodiment, starting point may be a PCB. Preferably, such a PCB may be equipped with at least four metal layers, for instance having a thin copper structure outside, and a thick copper structure inside. Such a configuration may be highly advantageous to achieve a very low stray inductance design.

The manufacturing process may then continue by screen printing of solder on the PCB followed by a leadframe attach at the top of the PCB. Moreover, a flip chip die attach may be carried out. It may also be possible to execute a screen printing process for applying solder on a ceramic carrier such as a DCB or an AMB. The DCB or AMB may be placed on the back side of the chip. A reflow process and a cleaning process may be carried out. Encapsulation may be carried out for instance by molding, followed by post mold curing. An automatic optical inspection (AOI) and/or an electric function test may then be carried out with the package. Moreover, solder may be applied on a base plate or a pinfin plate of a heat sink to be connected with the package, or to the package itself. Heat sink and package may then be connected for instance by soldering.

Thus, an exemplary embodiment may provide an intelligent package architecture being in particular highly appropriate for high power modules, with the potential to reduce the manufacturing effort and improve reliability (in particular by omitting wire bonds). Furthermore, exemplary embodiments may provide packages with higher integration. In particular, a gate driver board and a PCB carrying gate drivers and passives can be merged into a common power module. In addition, a package according to an exemplary embodiment may allow to realize highly efficient inverters in view of a superior design for low stray inductance and easy integration of snubber capacitors.

Figure 1:
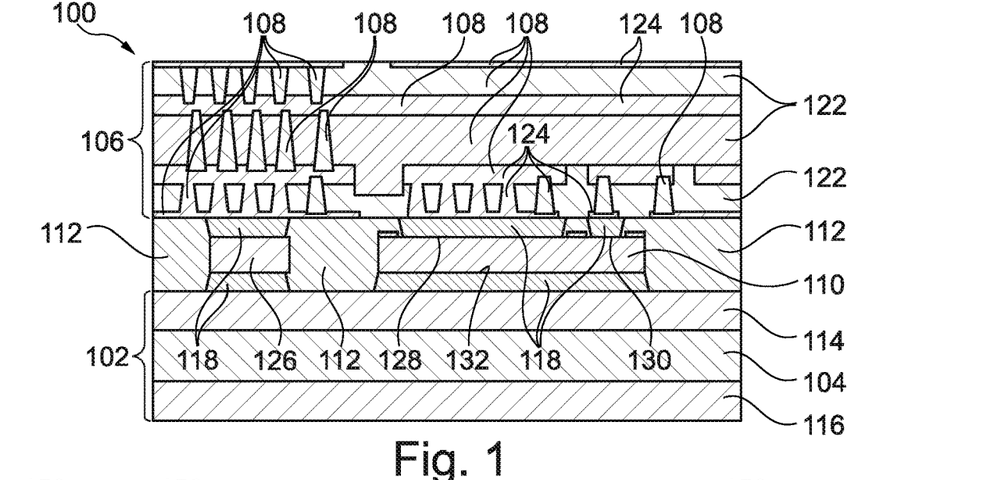
FIG. 1 illustrates a schematic cross-sectional view of a package according to an exemplary embodiment.

FIG. 1 illustrates a schematic cross-sectional view of a package 100 according to an exemplary embodiment.

The illustrated package 100 is configured as semiconductor power package having an electronic component 110 which is a semiconductor power chip (for instance a MOSFET chip). Hence, a considerable amount of heat may be created in an interior of the package 100 during operation.

As shown, a bottom portion of the package is constituted by a carrier 102 which is here embodied as a Direct Copper Bonding (DCB) substrate. The carrier 102 comprises a central plate embodied as thermally conductive and electrically insulating layer 104. Said central plate may be a ceramic plate, for instance made of aluminum nitride which may have a very high thermal conductivity of more than 100 W/mK. Moreover, the carrier 102 comprises a first electrically conductive layer 114, such as a copper layer, on a first main face (which is here an upper main surface) of the thermally conductive and electrically insulating layer 104. Beyond this, the carrier 102 comprises a second electrically conductive layer 116, such as a further copper layer, on a second main face (which is here a lower main surface) of the thermally conductive and electrically insulating layer 104 opposing the first main face. As shown, the electronic component 110 is mounted on the first electrically conductive layer 114 by an electrically conductive connection medium 118, such as a solder. As shown as well, the second electrically conductive layer 116 is exposed at a lower main surface of the package 100.

Moreover, the package 100 comprises a laminate 106 connected to an upper main surface of the electronic component 110 and being embodied here as a printed circuit board (PCB). The laminate 106 comprises a plurality of laminate layers 108 interconnecting by lamination, i.e. by pressing together the laminate layers 108 at high temperature. More specifically, the laminate 106 comprises a plurality of dielectric layers 122 made of FR4 material and comprises a plurality of electrically conductive layers 124 made of copper. Each of the dielectric layers 122 is embodied as a planar sheet. Some of the electrically conductive layers 124 are embodied as structured copper foils arranged in parallel to each other in horizontal planes of the laminate 106. Others of the electrically conductive layers 124 are embodied as copper vias which extend vertically through the laminate 106.

As shown, the electronic component 110 is mounted on a lowermost electrically conductive layer 124 of the laminate 106 by an electrically conductive connection medium 118, such as a solder. Consequently, the electronic component 110 is interposed vertically between the carrier 102 and the laminate 106.

A mold-type encapsulant 112 is arranged in gaps between the carrier 102 and the laminate 106 and encapsulates the electronic component 110 laterally. Exposed sidewalls of the encapsulant 112 are aligned with exposed sidewalls of the carrier 102 and of the laminate 106. The encapsulant 112 comprises a mold compound and mechanically protects and electrically insulates the encapsulated electronic component 110 with respect to an environment. The encapsulant 112 is arranged between the carrier 100 and the laminate 106 so that the uppermost electrically conductive layer 114 of the carrier 102 faces a bottom side of the encapsulant 112. Correspondingly, a lowermost electrically conductive layer 124 of the laminate 106 faces a top side of the encapsulant 112.

Advantageously, an electrically conductive through connection 126 extends vertically through the entire encapsulant 112. For example, the electrically conductive through connection 126 may be a copper pillar. As shown, the electrically conductive through connection 126 electrically couples the first electrically conductive layer 114 of the carrier 102 with the lowermost electrically conductive layer 124 of the laminate 106. The mentioned electric connections between the electrically conductive through connection 126 on the one hand and the carrier 102 and the laminate 106 on the other hand can be created by an electrically conductive connection medium 118, such as a solder.

The bottom side of the electronic component 110 may be electrically coupled by electrically conductive connection medium 118 on its bottom side, by the first electrically conductive layer 114 of the carrier 102, by electrically conductive connection medium 118 at the bottom side of the electrically conductive through connection 126, through the electrically conductive through connection 126, by electrically conductive connection medium 118 at the top side of electrically conductive through connection 126 with redistribution layers formed by the electrically conductive layers 124 of the laminate 106. Functionally, the electrically conductive layers 124 route electric signals propagating through laminate 106 during operation of the package 100. As described above, the electrically conductive through connection 126 contributes to an electric coupling of a bottom side of the electronic component 110 horizontally along the carrier 102 and upwardly with the laminate 106.

Such an electric coupling may be highly advantageous in particular when, as in the shown embodiment, the electronic component 110 experiences a vertical current flow during operation. More specifically, the illustrated electronic component 110 is embodied as field effect transistor chip having a source pad 128 and a gate pad 130 on its upper main surface which face the laminate 106. Furthermore, the transistor chip has a drain pad 132 on its lower main surface facing the carrier 102.

In other embodiments using an electronic component 110 with lateral current flow (for instance manufactured in gallium nitride technology), the illustrated electrically conductive through connection 126 may be omitted.

In view of the electrically conductive horizontal layers and the electrically conductive vertical vias of the laminate 106, the electrically conductive laminate layers 124 form antiparallel electric connection paths. More specifically, electric signals propagating through the laminate 106 may include a propagation path horizontally along one direction and along the opposing other direction and/or vertically along one direction and along the opposing other direction. This allows obtaining small a stray inductance and consequently low signal losses.

As follows from the above description, the electric signal flow during operation of the package 100 occurs predominantly (or even completely) within laminate 106. The heat removal function of the package 100 for removing heat created by the electronic component 110 is however accomplished by the carrier 102 which is configured to thermally couple and electrically insulate the electronic component 110 with respect to an exterior of the package 100. Descriptively speaking, electric paths are established in the upper portion of the package 100, whereas thermal paths are established in the lower portion of the package 100.

Figure 2:
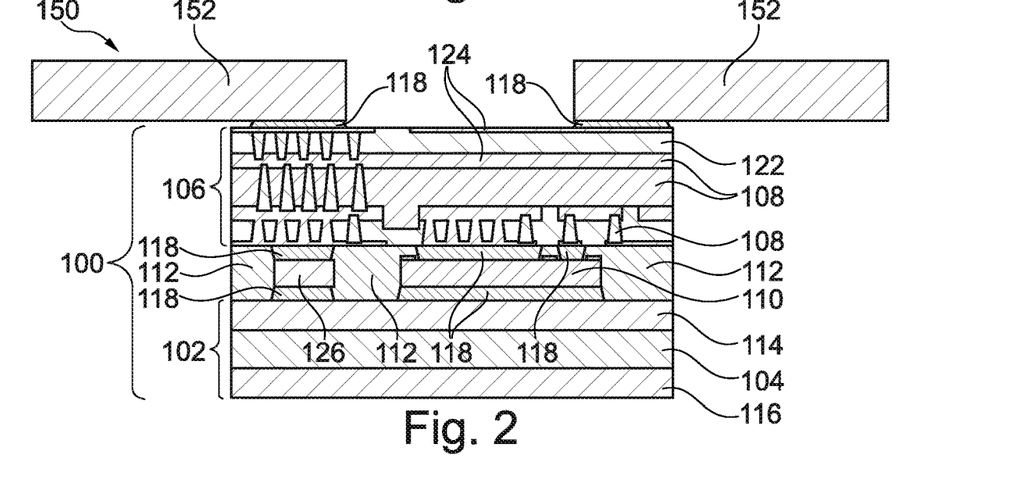
FIG. 2 illustrates a cross-sectional view of an electronic device comprising a package according to an exemplary embodiment and being mounted on a mounting base.

FIG. 2 illustrates a cross-sectional view of an electronic device 150 comprising a package 100 according to an exemplary embodiment and being mounted on a mounting base 152.

The illustrated electronic device 150 may be obtained by mounting the package 100 according to FIG. 1 on a mounting base 152 so that the mounting base 152 is physically connected with an exposed electrically conductive layer 124 of the laminate 106. Connection between the mounting base 152 and an electrically connected layer 124 of laminate 106 may be accomplished by an electrically conductive connection medium 118, such as a solder. For instance, the mounting base 152 may be a further printed circuit board (PCB) or a leadframe.

Figure 6:
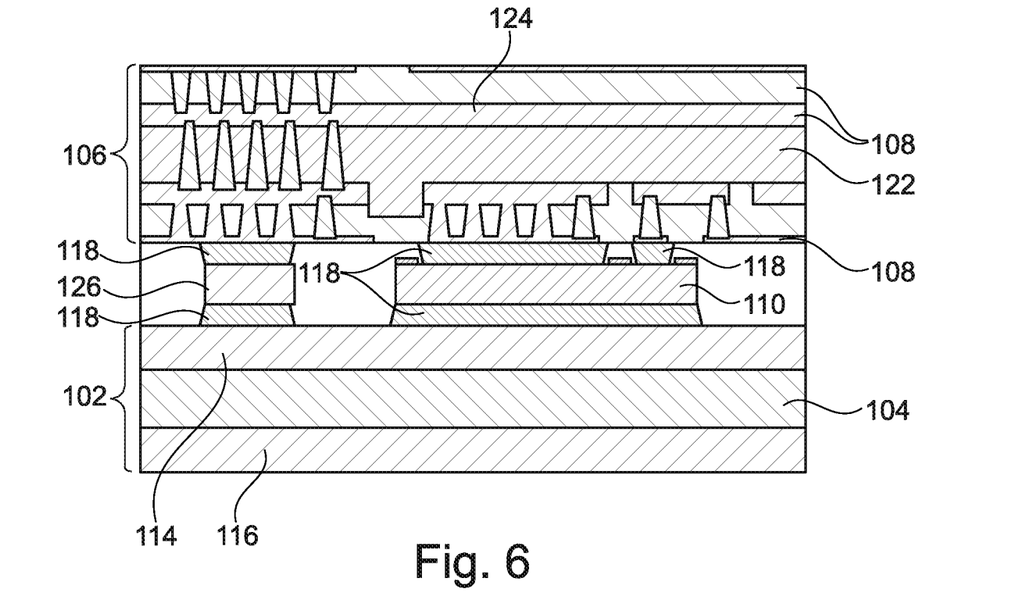
Figure 7:
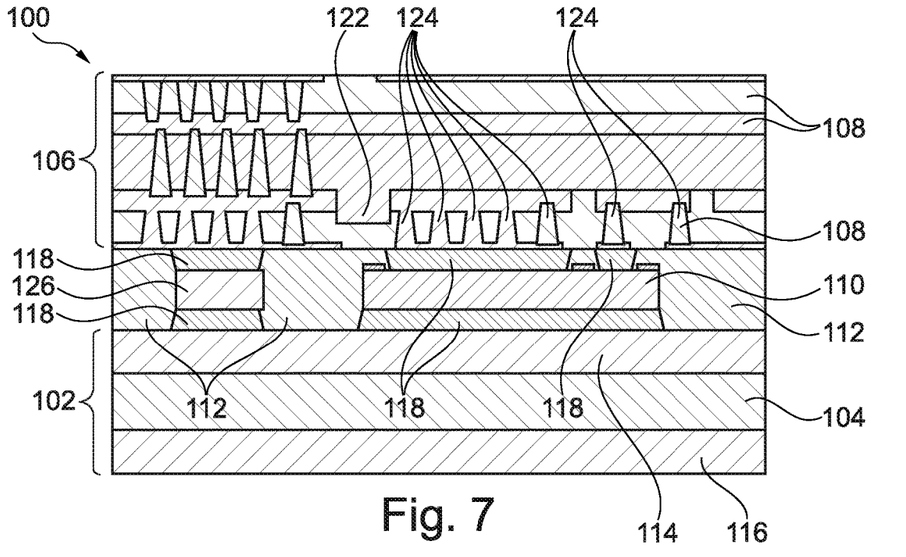
Figure 8:
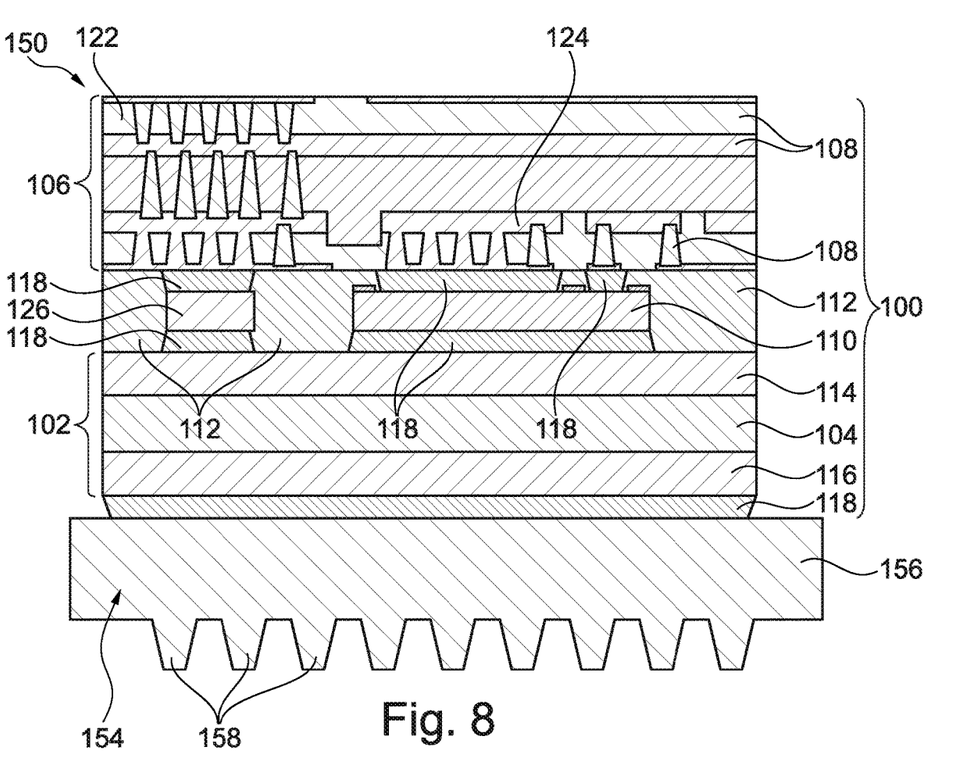

FIG. 3 to FIG. 8 show cross-sectional views of structures obtained during carrying out a method of manufacturing an electronic device 150 having a package 100, shown in FIG. 8, according to an exemplary embodiment.

Figure 3:
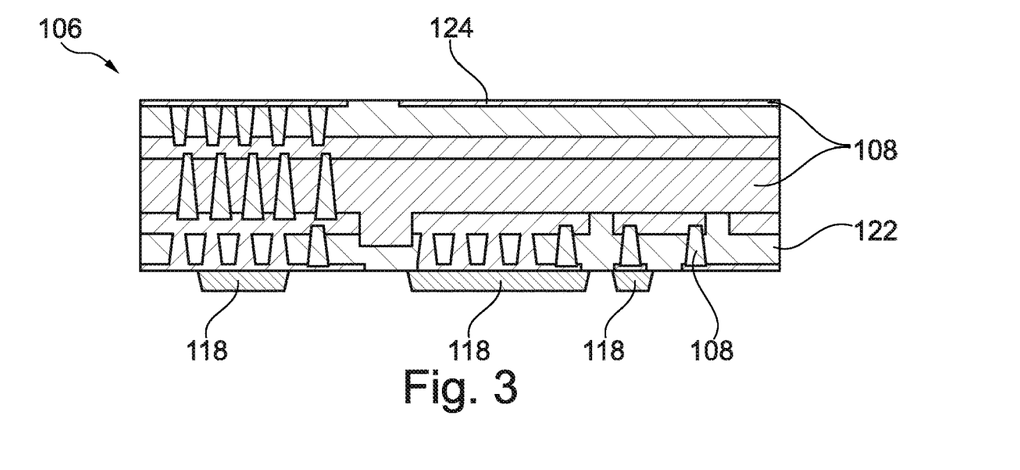
FIG. 3 to FIG. 8 show cross-sectional views of structures obtained during carrying out a method of manufacturing an electronic device with a package, shown in FIG. 8, according to an exemplary embodiment.

Referring to FIG. 3, a laminate 106 (such as a PCB) is provided which comprises a plurality of interconnected laminate layers 108, as described referring to FIG. 1. An electrically conductive connection medium 118, such as a solder, is applied to exposed electrically conductive surface portions at the lower main surface of the laminate 106.

Figure 4:
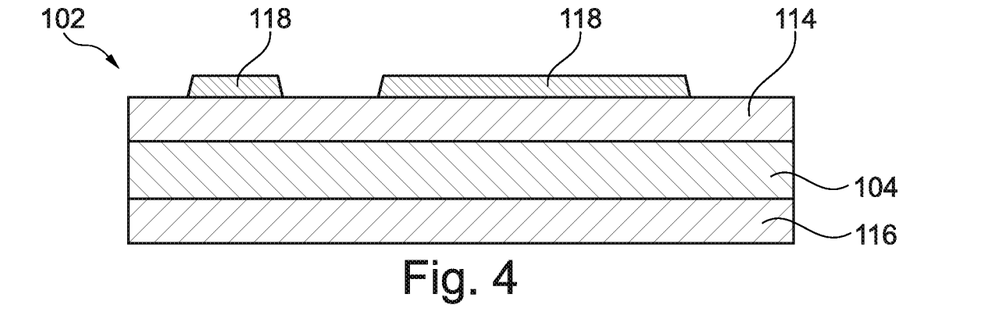

Referring to FIG. 4, a carrier 102 (such as a DCB substrate) composed of a central thermally conductive and electrically insulating layer 104 of ceramic and covered on both opposing main surfaces thereof with a respective electrically conductive layer 114, 116 of copper is provided, as explained above referring to FIG. 1. An electrically conductive connection medium 118, such as a solder, is applied to the first electrically conductive layer 114 at the upper main surface of the carrier 102.

Figure 5:
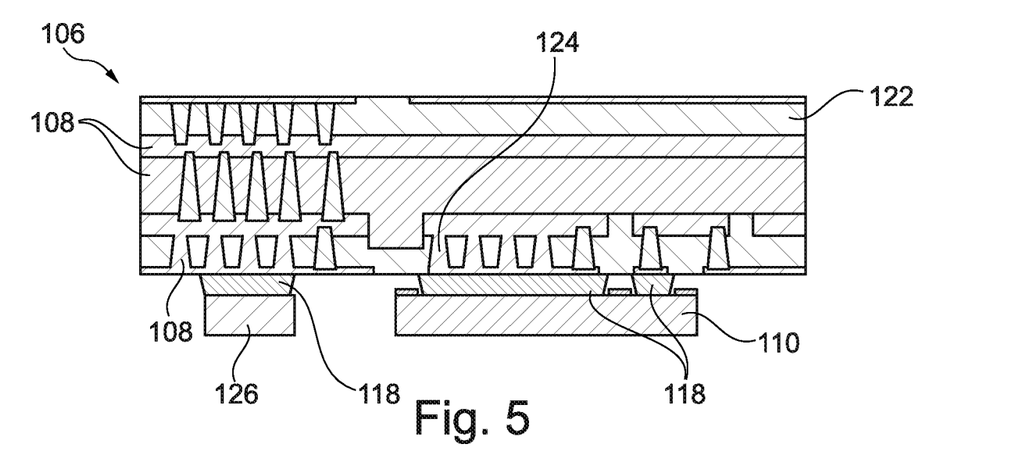

Referring to FIG. 5, the manufacturing method comprises mounting the electronic component 110 on the laminate 106 prepared according to FIG. 3. More specifically, the electronic component 110 may be mounted on the laminate 106 by electrically conductive connection medium 118, applied according to FIG. 3, by soldering. Furthermore, an electrically conductive through connection 126 (for instance a copper pillar) is mounted by soldering on the laminate 106 side by side with the electronic component 110 using electrically conductive connection medium 118 applied according to FIG. 3.

Referring to FIG. 6, the electronic component 110 and the electrically conductive through connection 126, both being already mounted on the laminate 106 according to FIG. 5, are connected with the carrier 102 being already prepared with electrically conductive connection medium 118 according to FIG. 4. This connection may be accomplished by said electrically conductive connection medium 118, i.e. by soldering. As a result, a semifinished product is obtained in which both the electronic component 110 as well as the electrically conductive through connection 126 are arranged between the carrier 102 at a bottom side and the laminate 106 at a top side.

Referring to FIG. 7, exposed surface portions of the electronic component 110 and facing surface portions of the carrier 102 and the laminate 106 are encapsulated by an encapsulant 112 being applied into gaps between the carrier 102 and the laminate 106. The encapsulant 112 may be a mold compound which mechanically protects and electrically insulates the encapsulated electronic component 110. As shown, the encapsulating process may be carried out after the mounting of electronic component 110 and electrically conductive through connection 126 between carrier 102 and laminate 106. As a result, a package 100 according to an exemplary embodiment is obtained according to FIG. 7.

Referring to FIG. 8, a heat sink 154 is physically connected with the exposed second electrically conductive layer 116 of the carrier 102 by an electrically conductive connection medium 118 in between, in particular by soldering. The heat sink 154 comprises a highly thermally conductive plate 156 which is attached by the electrically conductive connection medium 118 to the second electrically conductive layer 116 of the carrier 102. A plurality of cooling fins 158 may be integrally formed with and may extend from the highly thermally conductive plate 156. For instance, the heat sink 156 may be made of aluminum or copper. Hence, a highly efficient cooling path may be created from the electronic component 110 vertically through the carrier 102 up to the heat sink 154.

Figure 9:
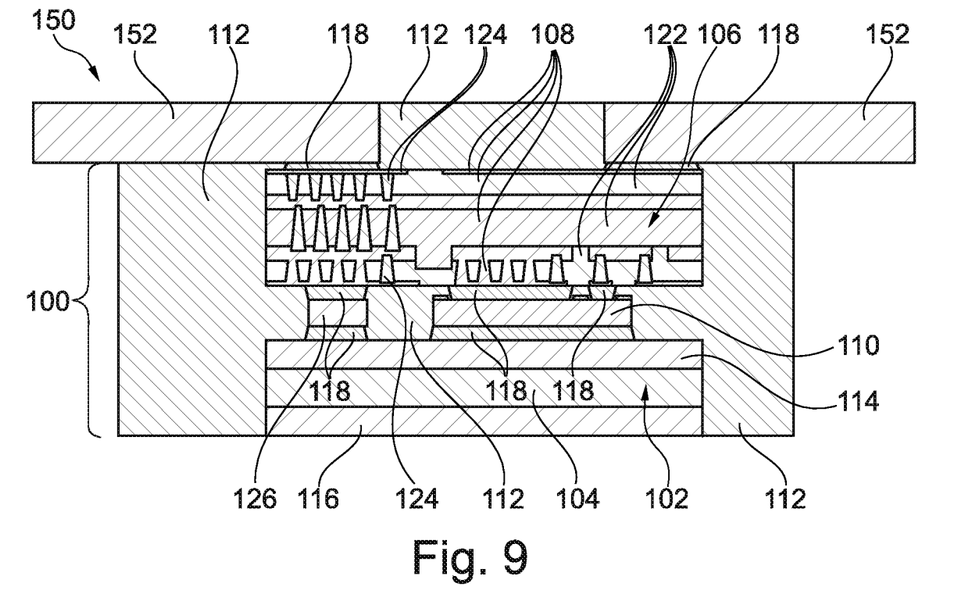
FIG. 9 illustrates a schematic cross-sectional view of an electronic device comprising a package according to still another exemplary embodiment.

FIG. 9 illustrates a schematic cross-sectional view of an electronic device 150 comprising a package 100 according to still another exemplary embodiment.

The electronic device 150 according to FIG. 9 differs from the electronic device 150 according to FIG. 2 in particular in that, according to FIG. 9, the encapsulant 112 additionally encapsulates sidewalls of the carrier 102 and the entire laminate 106, as well as also part of the mounting base 152.

As a result, a proper electric insulation of the laminate 106 and of the electronic component 110 may be achieved. At the same time, the heat removal path out of the package 100 may remain fully intact, since the lower main surface of the carrier 102 is still exposed with respect to the environment.

Figure 10:
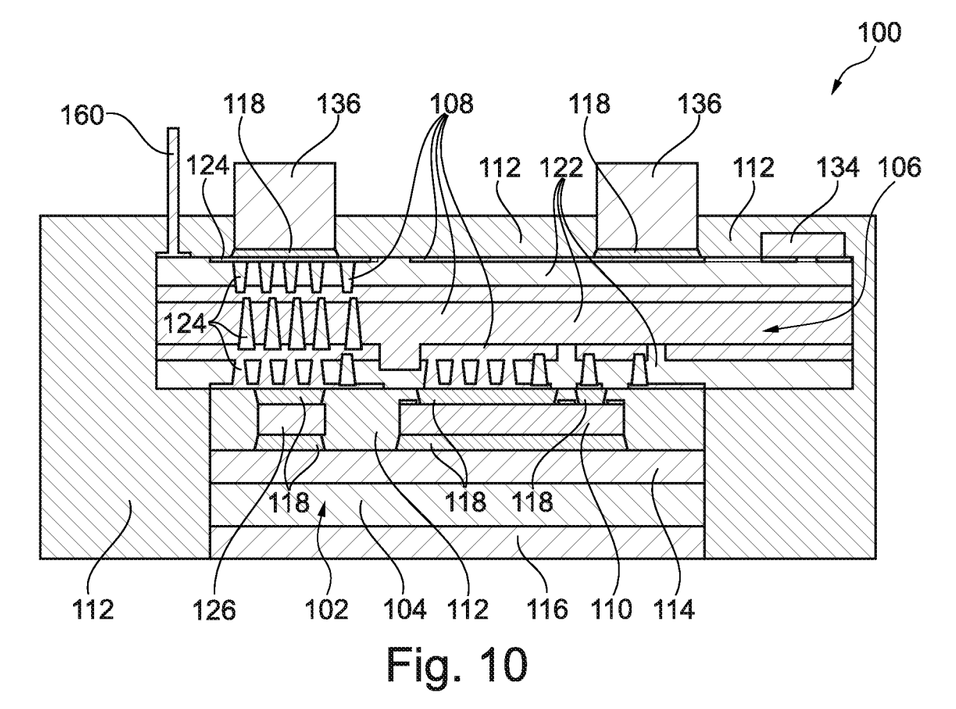
FIG. 10 illustrates a schematic cross-sectional view of a package according to yet another exemplary embodiment.

FIG. 10 illustrates a schematic cross-sectional view of a package 100 according to yet another exemplary embodiment.

The embodiment according to FIG. 10 differs from the embodiment according to FIG. 9 in particular in that, according to FIG. 10, no mounting base 152 is provided, but two bolt members 136 are mounted on the laminate 106. The bolt members 136 are only partially encapsulated by encapsulant 112 so as to partially extend beyond the encapsulant 112. The bolt members 136 are configured for establishing an electrically conductive connection with a counterpart (not shown) by establishing a screwing connection between the bolt members 136 which may have a thread. As shown as well in FIG. 10, a pin shaped connection element 160 which is also mounted on a top surface of the laminate 106, is partially encapsulated by encapsulant 112 and partially extends beyond the encapsulant 112 so as to be accessible from an outer side of the package 100.

Beyond this, a further electronic component 134 is surface mounted on the laminate 106 and is encapsulated by the encapsulant 112. The further electronic component 134 can for instance be a passive component or an active component. The further electronic component 134 may be mounted on an electrically conductive layer 124 as an exterior surface of the laminate 106 and may functionally cooperate with the electronic component 110, if desired.

Figure 11:
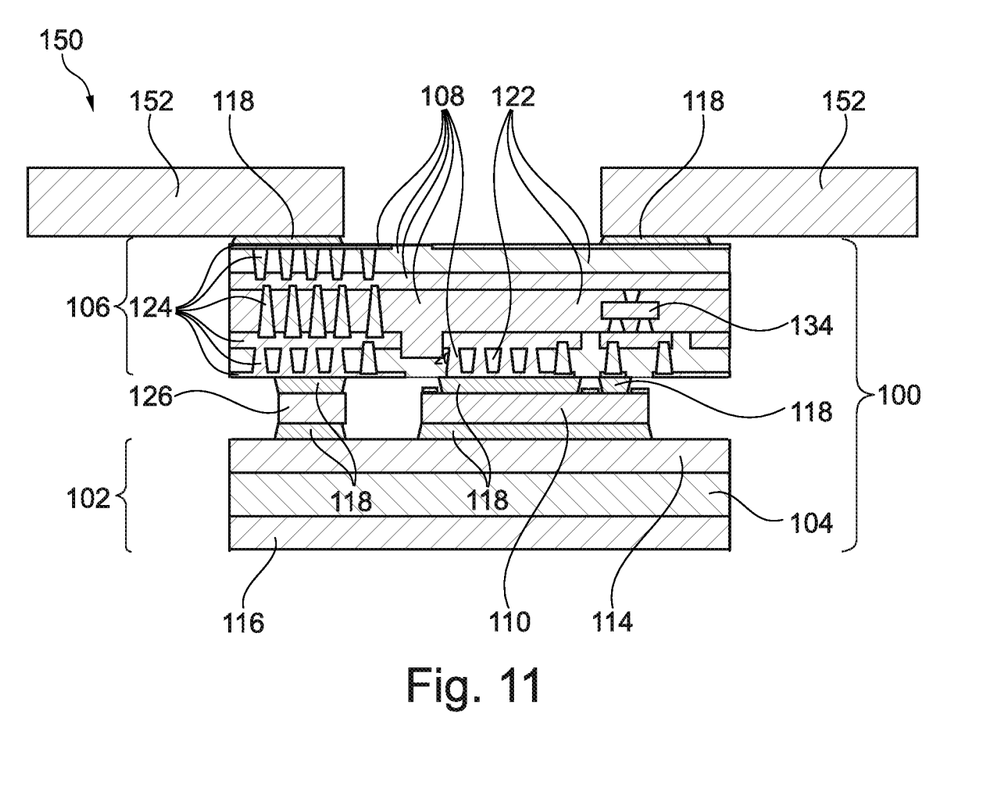
FIG. 11 illustrates a schematic cross-sectional view of a preform of a package according to another exemplary embodiment before encapsulation.

FIG. 11 illustrates a schematic cross-sectional view of a preform of an electronic device 150 comprising a package 100 according to another exemplary embodiment before encapsulation. The preform according to FIG. 11 can be further processed by encapsulation for obtaining an electronic device 150 similar to FIG. 9.

However, in contrast to the embodiment of FIG. 9, the embodiment of FIG. 11 comprises a further electronic component 134 which is here embedded in the laminate 106. The further electronic component 134 can for instance be a passive component or an active component. The further electronic component 134 may be electrically connected with an electrically conductive layer 124 inside the laminate 106 and may functionally cooperate with the electronic component 110, if desired.

FIG. 11 shows the preform after ceramic attach and reflow, but before encapsulation.

It should be noted that the term "comprising" does not exclude other elements or features and the "a" or "an" does not exclude a plurality. Also, elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A package, wherein the package comprises:
   a carrier comprising a thermally conductive and electrically insulating layer, a planar first electrically conductive layer on a first main face of the thermally conductive and electrically insulating layer, and a planar second electrically conductive layer on a second main face of the thermally conductive and electrically insulating layer opposing the first main face;
   a laminate comprising a plurality of connected laminate layers;
   an electronic component mounted between the carrier and the laminate; and
   an encapsulant being at least partially arranged between the carrier and the laminate and encapsulating at least part of the electronic component.

2. The package according to claim 1, wherein the thermally conductive and electrically insulating layer comprises or consists of a ceramic and/or has a thermal conductivity of at least 10 W/mK.

3. The package according to claim 1, wherein the carrier is configured to thermally couple and electrically insulate the electronic component with respect to an exterior of the package.

4. The package according to claim 1, wherein the first electrically conductive layer of the carrier faces the encapsulant.

5. The package according to claim 1, wherein the laminate layers are configured to form a redistribution structure.

6. The package according to claim 1, wherein the laminate layers are configured to form antiparallel electric connection paths.

7. The package according to claim 1, wherein an electrically conductive layer of the laminate faces the encapsulant.

8. The package according to claim 1, wherein the laminate is a printed circuit board.

9. The package according to claim 1, comprising an electrically conductive through connection extending through the encapsulant and electrically coupling at least one of the electronic component and the carrier with the laminate.

10. The package according to claim 1, wherein the electronic component is a semiconductor power chip.

11. The package according to claim 1, wherein the electronic component experiences a vertical current flow during operation.

12. The package according to claim 1, comprising an electrically conductive connection medium between the electronic component and the carrier.

13. The package according to claim 1, comprising an electrically conductive connection medium between the electronic component and the laminate.

14. The package according to claim 12, wherein the electrically conductive connection medium comprises at least one of the group consisting of a solder, in particular a transient liquid phase solder, a sinter material, and an electrically conductive adhesive.

15. The package according to claim 1, wherein the encapsulant encapsulates at least part of the carrier and/or at least part of the laminate.

16. The package according to claim 1, comprising at least one of the following features:
the package comprises at least one further electronic component embedded in and/or surface mounted on the laminate;
the package comprises a bolt member mounted on the laminate and being configured for establishing an electrically conductive connection with a counterpart device, in particular by screwing.

17. An electronic device, comprising:
a package according to claim 1; and
a mounting base on which the package is mounted.

18. The electronic device according to claim 17, comprising at least one of the following features:
wherein the mounting base is physically connected with the laminate, in particular by an electrically conductive connection medium;
wherein the electronic device comprises a cooling body, in particular a heat sink, physically connected with the carrier, in particular by an electrically conductive connection medium.

19. A method of manufacturing a package, wherein the method comprises:
providing a carrier comprising a thermally conductive and electrically insulating layer, a planar first electrically conductive layer on a first main face of the thermally conductive and electrically insulating layer, and a planar second electrically conductive layer on a second main face of the thermally conductive and electrically insulating layer opposing the first main face;
providing a laminate comprising a plurality of connected laminate layers;
mounting an electronic component between the carrier and the laminate; and
encapsulating at least part of the electronic component by an encapsulant which is at least partially arranged between the carrier and the laminate.

20. The package according to claim 1, wherein a sidewall of the thermally conductive and electrically insulating layer is aligned with a sidewall of the first electrically conductive layer and a sidewall of the second electrically conductive layer.

* * * * *